United States Patent [19]
Kato

[11] Patent Number: 5,460,319
[45] Date of Patent: Oct. 24, 1995

[54] LEAD, METHOD OF ASSEMBLING AN INTEGRATED CIRCUIT DEVICE, INTEGRATED CIRCUIT DEVICE, LEAD FOR PROVIDING A CONDUCTIVE PATH AND METHOD OF PROVIDING A CONDUCTIVE PATH

[75] Inventor: Hazime Kato, Itami, Japan

[73] Assignee: Mitsubishi Denki Kabushiki Kaisha, Tokyo, Japan

[21] Appl. No.: 80,622

[22] Filed: Jun. 22, 1993

[30] Foreign Application Priority Data

Jul. 1, 1992 [JP] Japan ..................................... 4-174280

[51] Int. Cl.[6] ...................................................... H05K 3/34
[52] U.S. Cl. ..................... 228/180.1; 228/204; 174/52.4; 174/260; 174/94 R; 361/773
[58] Field of Search ................................. 228/180.1, 204, 228/180.21; 174/94 R, 52.4, 260; 361/772, 773

[56] References Cited

U.S. PATENT DOCUMENTS

| | | | |
|---|---|---|---|
| 3,541,225 | 11/1970 | Raciti | 228/180.1 |
| 4,257,668 | 3/1981 | Ellis, Jr. | 228/215 |
| 4,478,364 | 10/1984 | Ditzig | 228/180.1 X |
| 4,647,126 | 3/1987 | Sobota | 361/773 X |
| 4,656,442 | 4/1987 | Hayakawa | 361/773 X |
| 4,991,059 | 2/1991 | Kiyose | 361/773 |
| 5,096,425 | 3/1992 | Takahashi | 361/773 X |
| 5,177,326 | 1/1993 | Goldhammer | 257/693 |
| 5,241,134 | 8/1993 | Yoo | 228/180.21 X |
| 5,270,492 | 12/1993 | Fukui | 174/52.4 |

*Primary Examiner*—Kenneth J. Ramsey
*Attorney, Agent, or Firm*—Leydig, Voit & Mayer

[57] ABSTRACT

A lead for achieving solder joining with great vibration strength includes an upper lead portion having a clip and a lower lead portion having a thin tip for insertion into an electrode in a lower substrate and an oblong through hole in the body of the lower lead portion for inducing capillarity of soldering flux.

49 Claims, 11 Drawing Sheets

LEAD, METHOD OF ASSEMBLING AN INTEGRATED CIRCUIT DEVICE, INTEGRATED CIRCUIT DEVICE, LEAD FOR PROVIDING A CONDUCTIVE PATH AND METHOD OF PROVIDING A CONDUCTIVE PATH

BACKGROUND OF THE INVENTION

1. Field of the Invention

The present invention relates to a lead used in an integrated circuit device, a method of assembling an integrated circuit device using the lead, an integrated circuit device thereby obtained, a lead for providing a conductive path from an electrode on a substrate and a method of providing a conductive path.

2. Description of the Background Art

Figure 9:
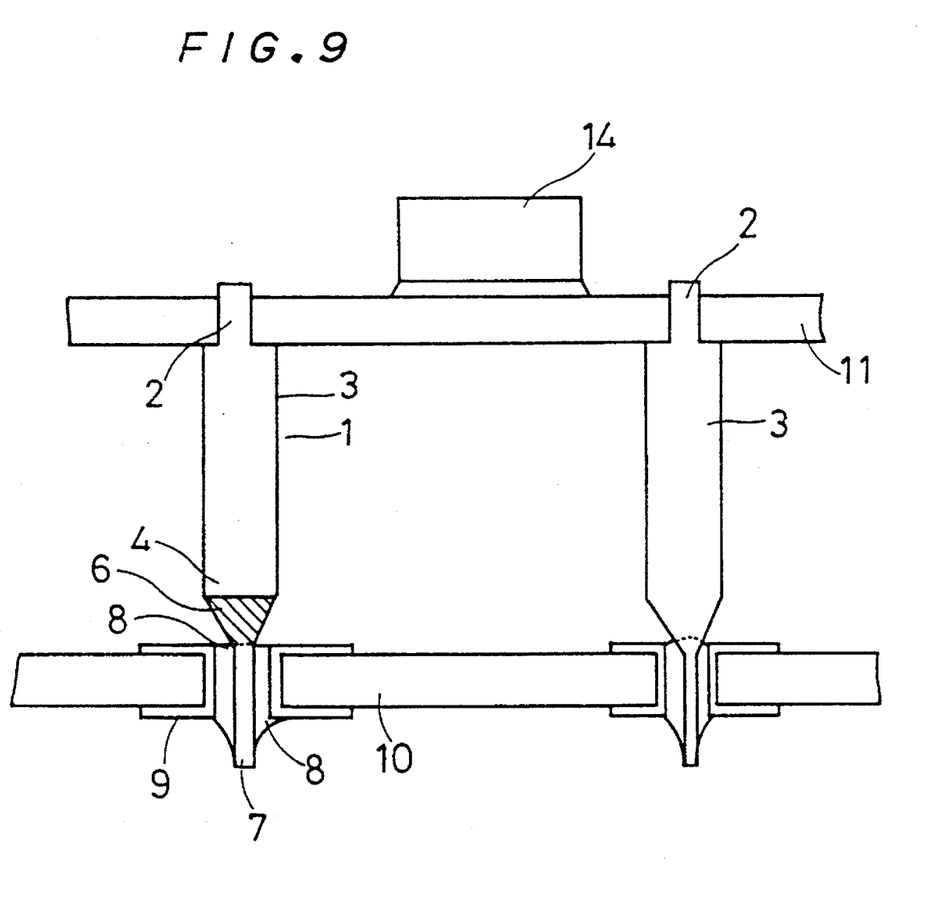
FIG. 9 is a front elevational view of a conventional hybrid integrated circuit device.
Figure 10:
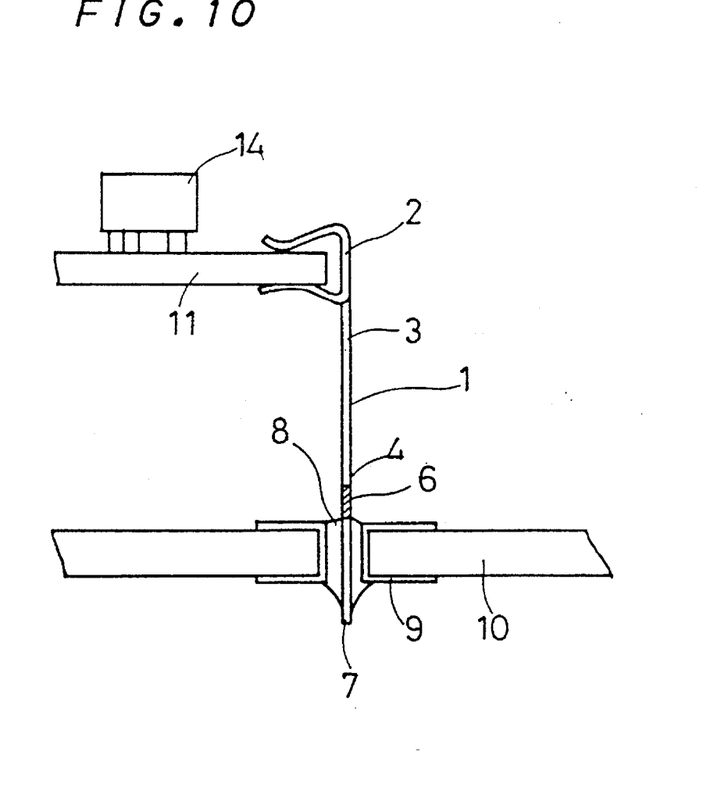
FIG. 10 is a side elevational view of FIG. 9.
Figure 11:
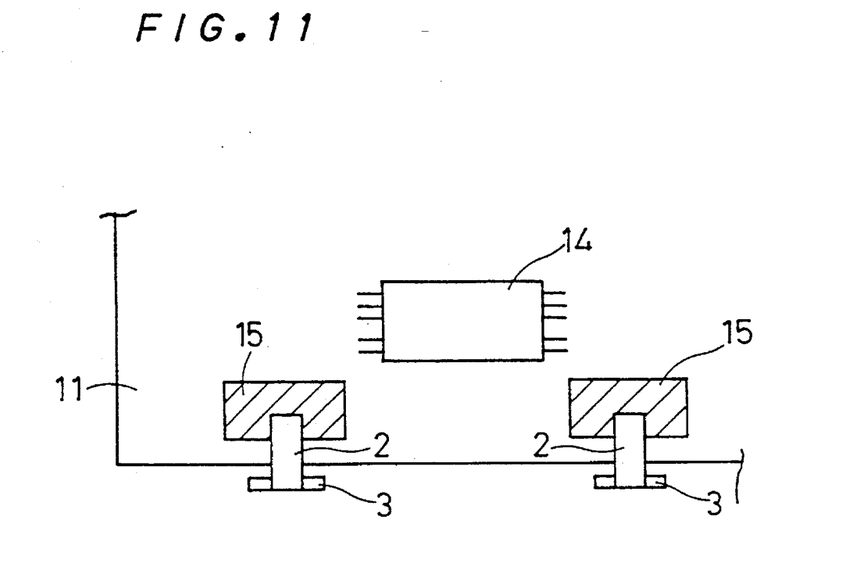
FIG. 11 is a plan view of FIG. 9.

FIG. 9 is a front elevational view of a conventional hybrid integrated circuit device. The hybrid integrated circuit device comprises a first circuit substrate 11 such as a thick film substrate, an electronic part 14 disposed on the first circuit substrate 11, a lead 1 extending perpendicularly from an edge of the first circuit substrate 11, a second circuit substrate 10 such as a printed board and a through-hole electrode 9 formed on the second circuit substrate 10. The lead 1 comprises an upper portion 3 having a clip 2 and a lower portion 4 including a tapered stopper 6 indicated by the shaded portion and a thin tip 7. The lead 1 is soldered to the through-hole electrode 9 by flow soldering while the tip 7 is inserted into the through-hole electrode 9. As shown in FIG. 10 looking from the left side of FIG. 9, the clip 2 holds the edge of the first circuit substrate 11 between upper and lower arms thereof. FIG. 11 is a plan view of FIG. 9. The upper arm of the clip 2 abuts a connecting pad 15 formed on the first circuit substrate 11.

When the lead 1 is soldered to the second circuit substrate 10 by flow soldering, solder 8 rises along the tip 7 of the lead 1 through a slight opening between the through-hole electrode 9 and the tip 7 inserted therein. However, when a back side of the second circuit substrate 10 is dipped into flux, the flux cannot reach the stopper 6. Therefore, in the next step of dipping the back side of the second circuit substrate 10 into fused solder, the solder hardly rises to the stopper 6.

When a vibration test (with vibrating power 4.4 G, in three directions respectively for 2 hours) is executed and the stopper 6 is not fixed by solder 8, the lead 1 experiences bending deformation over and over again at a fulcrum at the through-hole electrode 9 formed on the printed board 10 and the stopper 6 of the lead 1, and eventually fractures thereat. As the length of the lead 1 becomes longer so as to provide sufficient space between the first circuit substrate 11 and the second circuit substrate 10 for mounting some parts not only on a front surface of the second circuit substrate 10 but also on a back surface of the first circuit substrate 11, the bending deformation grows more serious and causes the lead 1 to fracture easily.

Accordingly, a conventional process of fabricating a hybrid integrated circuit device needs another steps of raising the solder to the stopper 6 of the lead 1 and/or coating a portion of the lead 1 subject to bending deformation with proper resin after the lead 1 is soldered by flow soldering so as to reinforce the lead 1.

SUMMARY OF THE INVENTION

The present invention is directed to a lead for supporting an upper substrate opposite a lower substrate and electrically connecting an electrode of the upper substrate and another electrode of the lower substrate.

According to the present invention, the lead comprises an upper portion for joining to the electrode of the upper substrate, and a lower portion fixed on the electrode of the lower substrate by solder, having a construction to generate capillarity of soldering flux.

The lead in accordance with the present invention is steadily provided with plenty of solder at the joint of the lower portion of the lead and the electrode of the lower substrate since the soldering flux rises along the lower portion of the lead by capillarity during soldering. As a result, the joint at the lower portion of the lead is reinforced, thus obtaining strong joining of the lead and the electrode. When the lower portion of the lead is provided with a through hole or a recess, for example, the soldering flux can rise along the lower portion by surface tension generated between the inside surface of the hole or recess and the soldering flux. Further, when the lower portion of the lead has a bend, it can prevent concentration of the stress at the joint.

According to the lead of the present invention, reliable joining of the lead and the electrode of the lower substrate can be achieved, so that the lead may be hard to fracture at the joint to the electrode. In addition, there is an economic advantage in that it is possible to obtain reliable joining of the lead and the electrode by providing only a simple through hole or a recess. Further, provision of a bend in the lower portion of the lead can prevent fracture at the joint of the lead and the electrode more surely. When a recess is provided by embossing, a rib is formed on the reverse side of the recess, whereby the lead may have greater mechanical strength and be hard to fracture.

The present invention is also directed to a method of assembling an integrated circuit device, wherein the integrated circuit device holds an upper substrate opposite a lower substrate and has electrical connections between a plurality of electrodes of the upper substrate and a plurality of electrodes of the lower substrate and a plurality of leads, each of the leads has an upper portion joined to each of the electrodes of the upper substrate and a lower portion fixed on electrodes of the lower substrate with solder, the lower portion having a construction to generate capillarity of soldering flux.

According to the present invention, a method comprises the steps of joining the upper portion of each of the leads to each of the electrodes of the upper substrate, and joining the lower portion of each of the leads to each of the electrodes of the lower substrate by soldering where the flux rises along the lower portion by capillarity.

In a method of assembling an integrated circuit device in accordance with the present invention, it is possible to steadily provide plenty of solder for the joint of the lower portion of the lead and the electrode of the lower substrate since the soldering flux rises along the lower portion by capillarity. The rising of the soldering flux can be accomplished by such a simple process as providing a through hole or a recess. Further, provision of a bend can relieve the stress applied to the joint of the lead. When at least a portion of the lower portion of each lead is stepped by bending and then a group of the leads are mounted in a line, arranging the joints of the leads and the electrodes in a cross-stitch manner on the lower substrate, i.e., in a manner that the bending directions of the leads are alternately opposite, the leads are hard to bend by the compressive and attractive force for the adjoining leads at the respective bent portions.

According to a method of assembling an integrated circuit device, joining with high reliability and firmness the lower portion of the lead and the electrode of the lower substrate can be achieved while preventing fracture of the lead. Moreover, the above effects can be accomplished through such a simple process such as providing a through hole or a recess. Provision of a bend in the lower portion of the lead can further reduce the possibility that the lead may fracture. When at least a portion of the lower portion of the lead is stepped by bending and then a group of the leads are mounted in a line, arranging the joints of the leads and the electrodes in a cross-stitch manner on the lower substrate, i.e., in a manner that the bending directions of the leads are alternately opposite, the strength of the lead may be further intensified.

The present invention is further directed to an integrated circuit device.

According to the present invention, the integrated circuit device comprises an upper substrate having a plurality of electrodes, a lower substrate having a plurality of electrodes, and a plurality of leads, each of the leads having an upper portion to be joined to electrodes of the upper substrate and a lower portion fixed on electrodes of the lower substrate by soldering solder, the lower portions having a construction to generate capillarity of soldering flux, wherein the lower portion of an leads is joined to each of the electrode of the lower substrate with capillary flow of the flux, and the upper substrate is held opposite the lower substrate by the leads.

The integrated circuit device in accordance with the present invention has electrodes of the lower substrate surely joined to the leads since the lower portion of each of the leads is reinforced by plenty of solder because of the flux flow by capillarity, and the upper substrate is firmly held by the leads. A simple construction such as a through hole or a recess enables the soldering flux to rise along the lower portion of the leads. A device employing the lead provided with a bend in the lower portion may have great vibration strength because less stress is applied to the joint of the lead and the electrode. Further, the device in which the lower portions of a plurality of leads are joined to the electrodes of the lower substrate while arranged in a cross-stitch manner has an effect that the leads are hard to bend because of the interaction between adjoining leads.

In the integrated circuit device of the present invention, the lower portion of the lead is joined to the electrode of the lower substrate with high reliability and firmness and is reinforced. Therefore, the device has great mechanical strength and vibration strength. The device employing the lead having a through hole or a recess, though simply constructed, has the above effect. The device employing the lead with a bend has greater vibration strength. Further, the device in which the joints of the leads and the electrodes of the lower substrate are arranged in a cross-stitch manner has much greater vibration strength.

The present invention is still directed to a lead for providing a conductive path from an electrode formed on a substrate.

According to the invention, a lead for providing a conductive path comprises a lower portion fixed on an electrode by soldering, having a construction to generate capillarity of soldering flux, and an upper portion for providing electrical connection to another object.

A lead for providing a conductive path in accordance with the present invention is firmly joined to the electrode of the lower substrate because the soldering flux rises along the lower portion of the lead by capillarity during soldering. When the lower portion of the lead is provided with a through hole or a recess, the soldering flux can rise along the lower portion by surface tension generated between the inside surface of the hole or recess and the soldering flux. Further, when the lower portion of the lead has a bend, it can prevent concentration of the stress applied through vibration to the joint of the lead and the electrode.

According to the invention, a lead for providing a conductive path is firmly joined to the electrode of a lower substrate. The lead can be obtained by such a simple process as providing a through hole or a recess. The lead provided with a recess by embossing has great mechanical strength because of a rib which is formed on the reverse side of the recess. Further, the lead with a bend in the lower portion can provide a conductive path with great vibration strength.

The present invention is directed to a method of providing a conductive path from an electrode formed on a substrate.

According to the invention, a method of providing a conductive path comprises the steps of preparing a lead including a lower portion fixed on an electrode by soldering, having a construction to generate capillarity of soldering flux, and an upper portion for providing electrical connection to another object, and joining the lower portion of the lead to the electrode by soldering where the flux rises to the lower portion by capillarity.

In a method of providing a conductive path in accordance with the present invention, a lead having construction to generate capillarity of the soldering flux is employed, therefore the lower portion of the lead is reinforced by plenty of solder and is surely joined to an electrode of the lower substrate, so that it is possible to provide a conductive path with great vibration strength. Further, use of the lead with a bend in the lower portion provides the conductive path with greater vibration strength. The conductive path with great vibration strength can be obtained by using the lead of simple construction having a through hole or a recess in the lower portion.

According to the invention, a conductive path with great vibration strength is provided. Further, a conductive path with greater vibration strength can be obtained by using a lead with a bend in the lower portion. It is advantageous that the conductive path with great vibration strength be provided by a lead of simple construction having a through hole or a recess in the lower portion.

Accordingly, it is an object of the present invention is to provide a lead having construction to ensure good solder flow to obtain an integrated circuit device with great vibration strength. It is a further object of the present invention to provide a method of assembling an integrated circuit device to achieve great vibration strength and to provide an integrated circuit device with great vibration strength. It is still another object of the present invention to provide a conductive path with great vibration strength and to provide a method of providing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

<EMBODIMENT 1>

Figure 1:
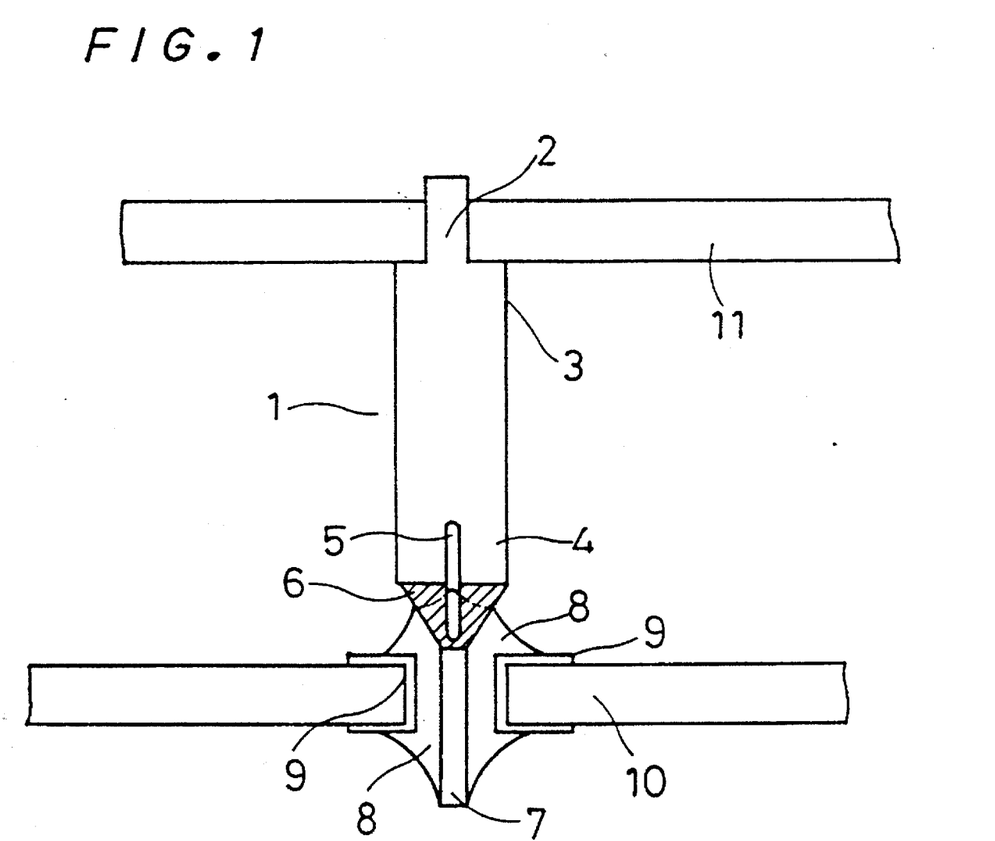
FIG. 1 is a front elevational view of a lead in a soldered state in accordance with a first preferred embodiment of the present invention.

FIG. 1 shows a hybrid integrated circuit device employing a lead 1 in accordance with the first preferred embodiment. A basic assembling method is the same as that for a conventional device as shown in FIGS. 9 to 11. FIG. 1 illustrates a part in association with a lead 1.

The lead 1 in accordance with the first preferred embodiment comprises an upper portion 3 and a lower portion 4. The upper portion 3 has a clip 2 and the lower portion 4 includes a thin tip 7, a tapered stopper 6 indicated by the shaded portion between the body of the lower portion 4 and a tip 7 and a long and slender through hole 5 which extends from the bottom of the stopper 6 to the body of the lower portion 4 linearly. The clip 2 holds the edge portion of the first circuit substrate 11, the upper substrate, between the upper and lower arms thereof as shown in FIG. 10. The tip 7 is inserted into a hole of a through-hole electrode 9, the through-hole electrode 9 including the trough hole in the second circuit substrate 10 and an electrically conducting coating on the through hole, the lower substrate, while the tip 7 and the stopper 6 are fixed by solder 8 to the through-hole electrode 9, i.e., they are fixed to the lower substrate 10.

The lead 1 is soldered to the lower substrate 10 by flow soldering. When a back surface of the lower substrate 10 is dipped into flux, the flux goes up through a slight opening between the through-hole electrode 9 and the tip 7 of the lead 1 inserted therein and further rises inside the hole 5 by capillarity, so that a considerable amount of flux 8 may reach the upper portion of the stopper 6. That facilitates solder rising to the stopper 6 in the next step where the lower substrate 10 is dipped into fused solder, with the result that enough solder can surely reach the stopper 6. Therefore, it is possible to steadily fix the lead 1 to the lower substrate 10.

Furthermore, the other aspects of construction are the same as the conventional device of FIGS. 9 to 11, so the description associated therewith will be omitted.

A exemplary method of assembling the hybrid integrated circuit device is as follows: First, the edge portion of upper substrate 11 is put in the clip 2 of the upper portion 3 while an upper arm of the clip 2 abuts a connecting pad shown in FIG. 11. Next, the tip 7 of the lead 1 is inserted into the through-hole electrode 9. The under surface of the lower substrate 10 is dipped into the fused flux while the tip 7 is inserted into the through-hole electrode 9. Then, the flux goes up through a slight opening between the through-hole electrode 9 and the tip 7 of the lead 1 inserted therein and further rises inside the hole 5 by capillarity, so that plenty of flux 8 can reach the upper portion of the stopper 6. After the lower substrate 10 is taken out from the fused flux, the under surface of the lower substrate 10 is dipped into fused solder. Since the flux reaches the upper portion of the stopper 6, the solder can easily rise to the stopper 6. Consequently, the stopper 6 may be provided with sufficient solder for joining the through-hole electrode 9 and the lower portion of the lead 1.

Figure 12:
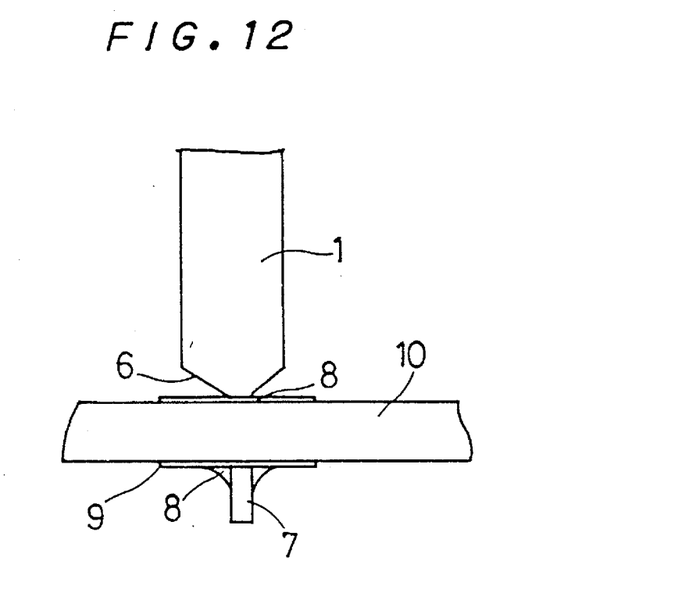
FIG. 12 is a front elevational view of a conventional lead in a soldered state.
Figure 13:
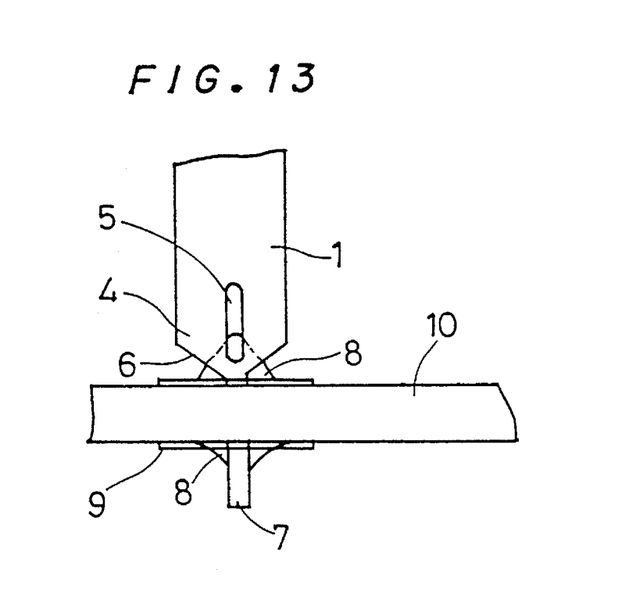
FIG. 13 is a front elevational view of the lead in a soldered state of the present invention.

FIG. 13 illustrates a state where the lead 1 having a construction according to the first preferred embodiment, i.e., with a long and slender through hole 5, is soldered to the through-hole electrode 9 while FIG. 12 illustrates a state where the lead 1 of the conventional construction, i.e., without a long and slender through hole 5 is soldered to the through-hole electrode 9. When a vibration test (with vibrating power 4.4 G, in three directions respectively for 2 hours) is executed for the joining conditions of both constructions, the root of the lead 1 of FIG. 12 fractures while that of FIG. 13 does not.

<EMBODIMENT 2>

Figure 2:
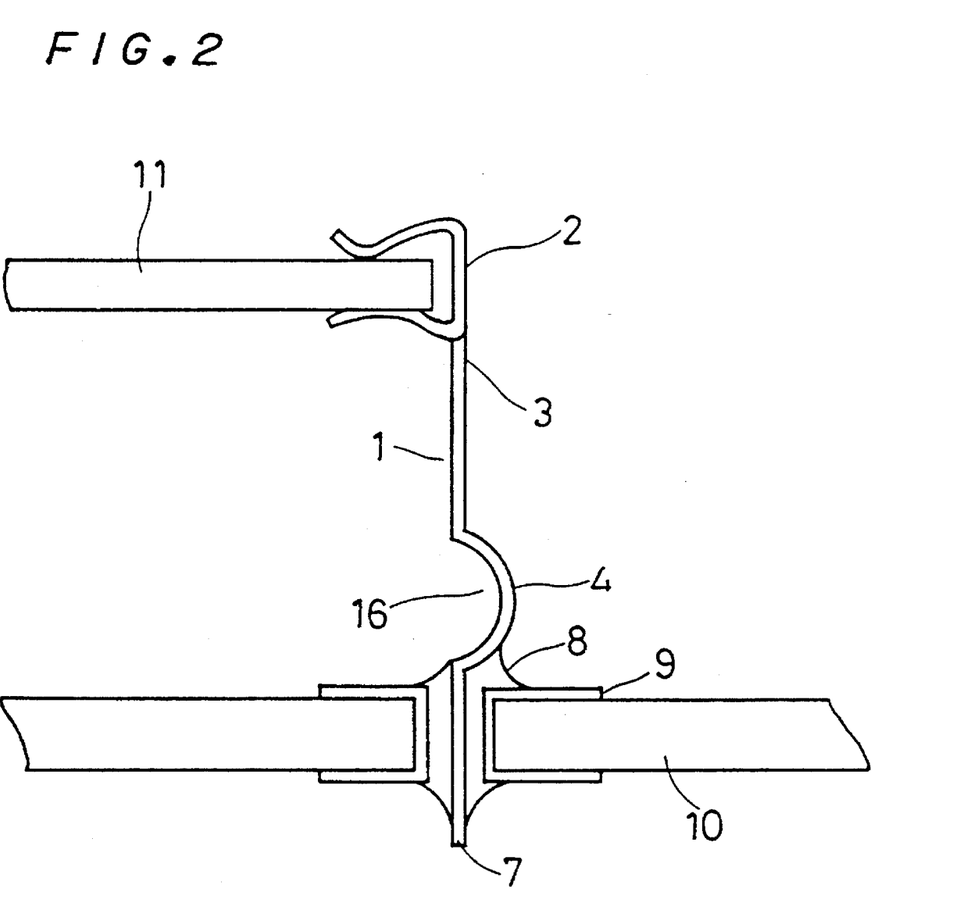
FIG. 2 is a side elevational view of a lead having a bend in a soldered state in accordance with a second preferred embodiment of the present invention.
Figure 3:
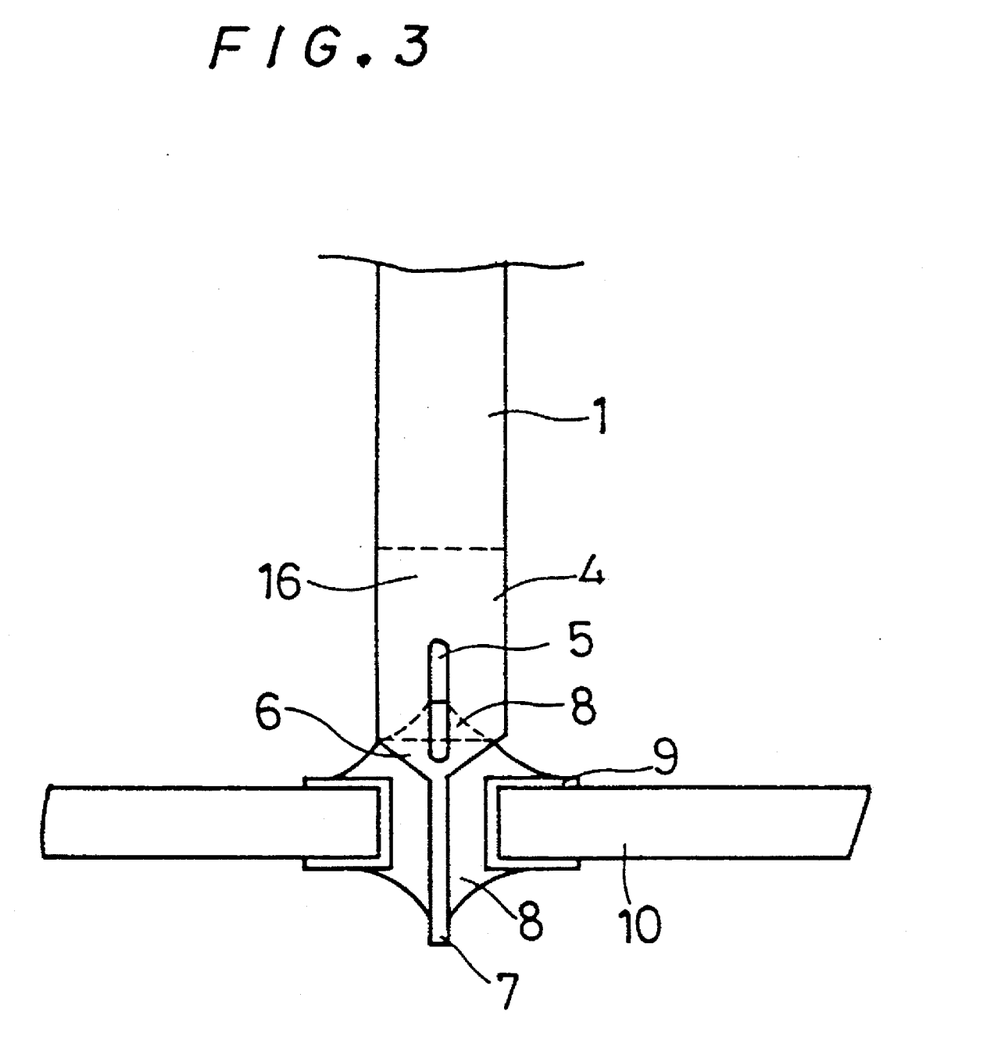
FIG. 3 is a partial front elevational view of FIG. 2.

The lead 1 in accordance with a second preferred embodiment includes a bend 16 in the lower portion 4 thereof, as shown in FIGS. 2 and 3. The other aspects of construction of the lead 1 are the same as that of the first preferred embodiment, so the description associated therewith will be omitted. FIG. 2 is a side elevational view and FIG. 3 is a front elevational view of a state where the lead 1 is soldered to the through-hole electrode 9.

According to the second preferred embodiment, the bend 16 can relieve the stress applied to the lower portion of the lead 1 through vibration. The arcuate bend 16 serves as a spring to disperse the stress which deforms the lead 1 in vertical and horizontal directions, to thereby relieve the concentration of the stress on the joint of the lead 1 and the through-hole electrode 9. Therefore, the lead 1 has less possibility of fracturing. Further, it is another advantage of the lead 1 that the solder 8 can easily rise to the bend 16.

The method of assembling the hybrid integrated circuit device of this preferred embodiment is the same as that of the first preferred embodiment.

<EMBODIMENT 3>

Figure 4:
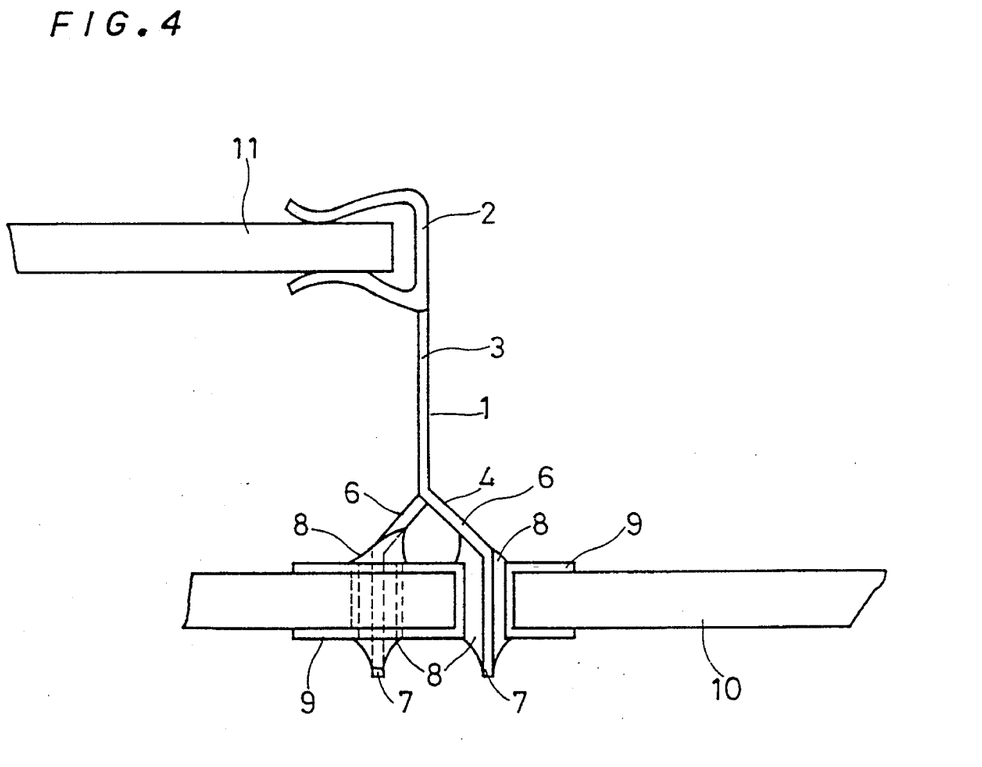
FIG. 4 is side elevational view showing a state where leads join to electrodes in a cross-stitch manner in accordance with a third preferred embodiment of the present invention.
Figure 5:
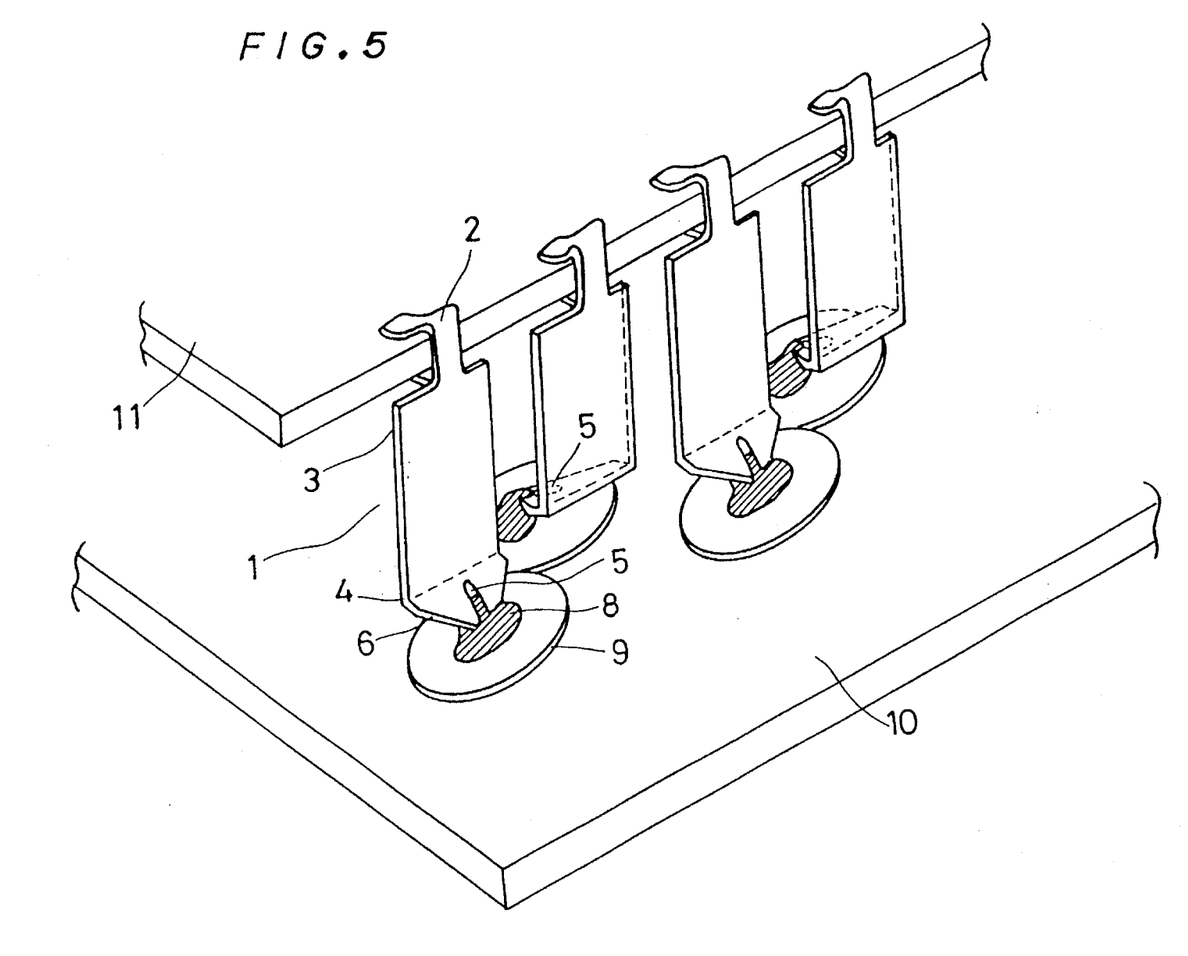
FIG. 5 is a perspective view of FIG. 4.

In a third preferred embodiment, the lower portion of the lead 1 is bent slightly above the stopper 6 and the lower end of the stopper 6, respectively, at an angle of about 45° in opposite directions, so as to be stepped as illustrated in FIG. 4. A plurality of leads 1 which are bent as described above are disposed between the lower substrate 10 and the upper substrate 11 while being arranged in a line so that the bending directions of the leads 1 are alternately opposite, as shown in FIG. 5, thus fabricating a hybrid integrated circuit device. FIG. 4 is a side elevational view and FIG. 5 is a front elevational view of the device. The other aspects of construction of the lead 1 are the same as that of FIG. 1, so the description associated therewith will be omitted.

This construction allows the stress applied to the leads 1 of FIG. 4 in left and right directions to function as compressive and tensile force for adjoining leads at each bent portion of the leads 1, so that the bending deformation of the leads 1 can be reduced. Therefore, the lead 1 has much less possibility of fracturing, i.e., the integrated circuit device of the third preferred embodiment has much greater vibration strength.

In assembling the hybrid integrated circuit device of the third preferred embodiment, the lead 1 is joined to the upper substrate 11 with the clip 2 in with the leads 1 bent to alternately opposite directions. The other aspects in the method of assembling the hybrid integrated circuit device of the third preferred embodiment are the same as that of the first preferred embodiment.

<EMBODIMENT 4>

Figure 6:
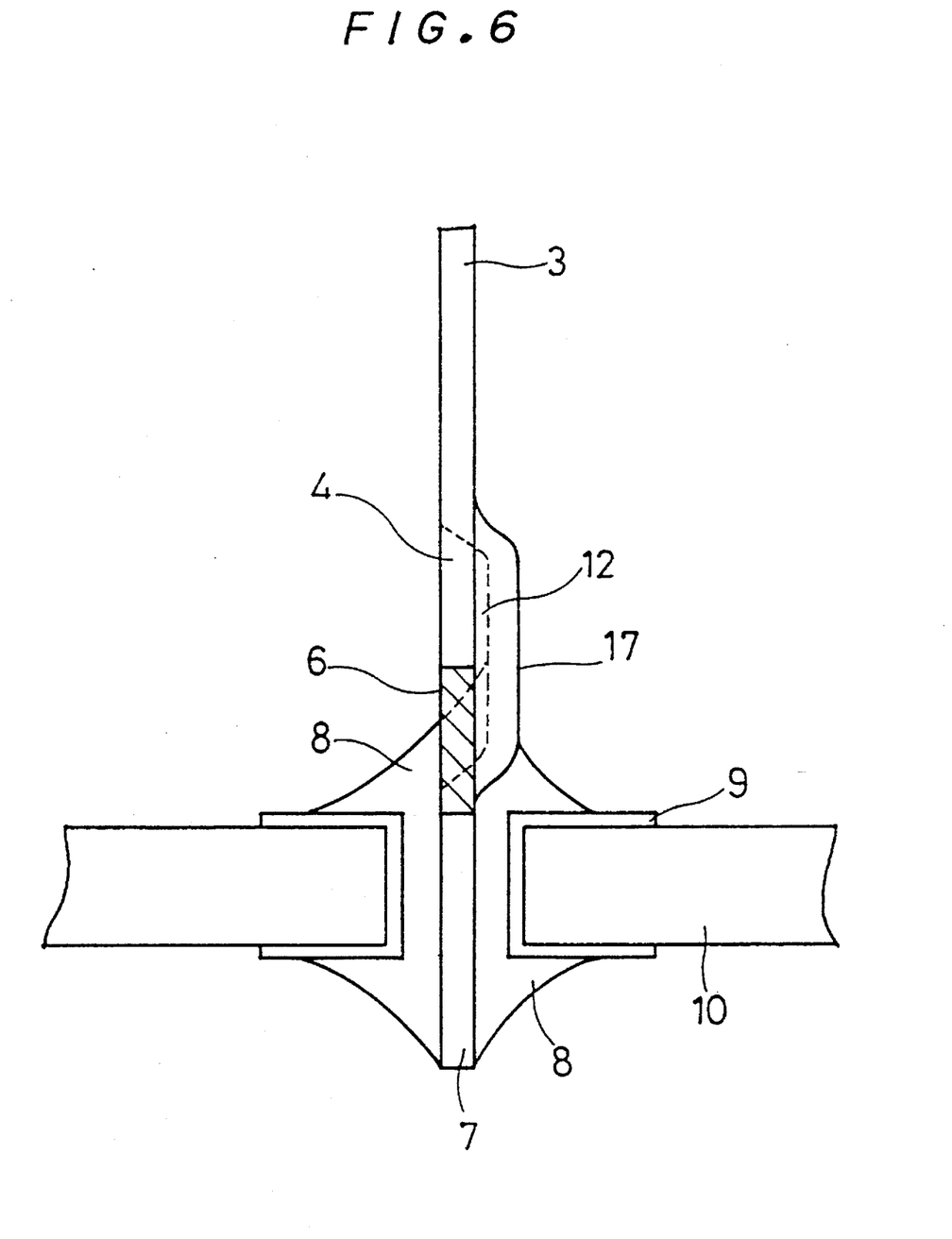
FIG. 6 is a side elevational view of a lead which is provided with a recess by embossing in a soldered state in accordance with a fourth preferred embodiment of the present invention.

The lead 1 in accordance with the fourth preferred embodiment is provided with an oblong recess 12 by embossing instead of the oblong through hole 5 in FIG. 1. The other aspects of construction of the lead 1 are the same as that of the first preferred embodiment shown in FIG. 1, so the description associated therewith will be omitted. FIG. 6 is a side elevational view of a state where the lead 1 having the recess 12 is soldered to the through-hole electrode 9. The front elevational view of FIG. 6 is the same as FIG. 1 except for replacement of the through hole 5 with the recess 12.

Also in the fourth preferred embodiment, the flux rises along the lower portion 4 of the lead 1 by capillarity generated inside the recess 12, so that more solder 8 can rise to the lower portion 4 of the lead 1. Moreover, a projecting rib 17 is also provided on the reverse side of the recess 12 by embossing, to thereby improve the mechanical strength of the lead 1 advantageously.

Further, the method of assembling the hybrid integrated circuit device of the fourth preferred embodiment is the same as that of the first preferred embodiment.

<MODIFICATION>

Figure 7:
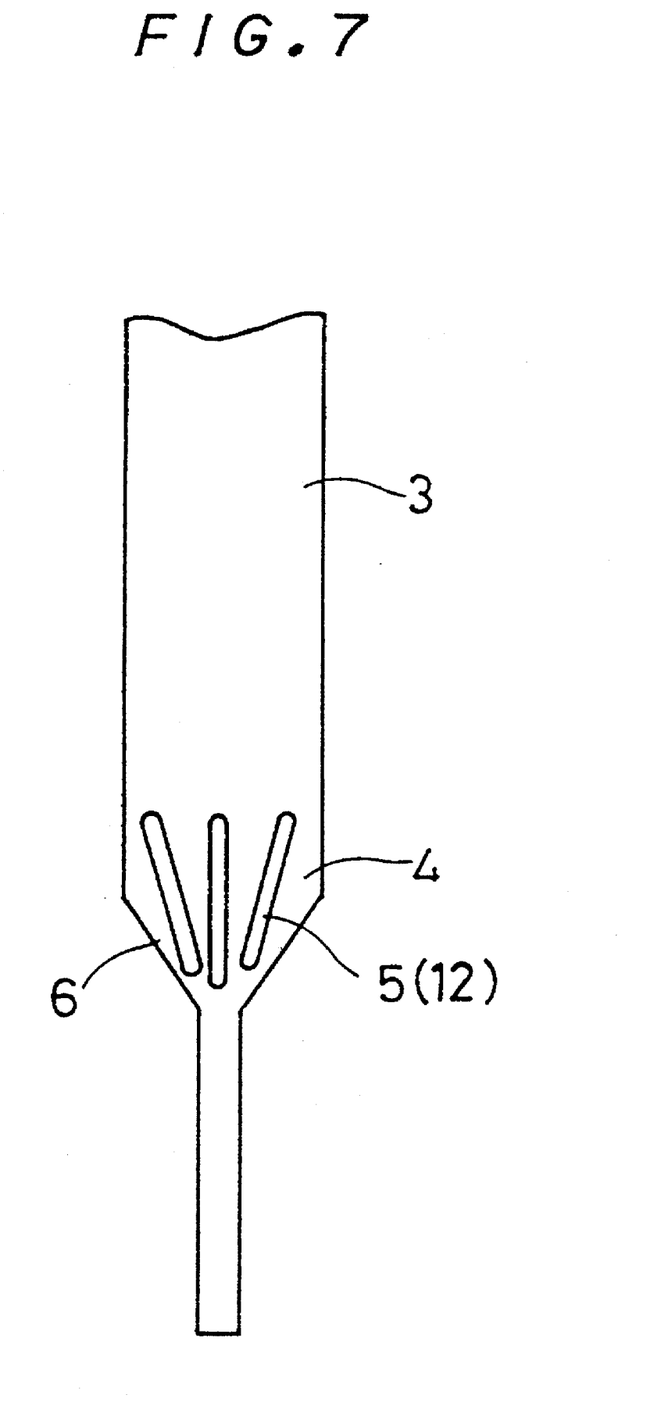
FIG. 7 is a front elevational view showing construction of a lower portion of a lead in accordance with a modification of the present invention.

Although in the above preferred embodiments the lower portion 4 of the lead 1 is provided with a long and slender through hole 5 or a long and thin recess 12, a plurality of through holes 5 or recesses 12 may be provided while being arranged in a row, as shown in FIG. 7, to thereby obtain better flux and solder rising.

Figure 8:
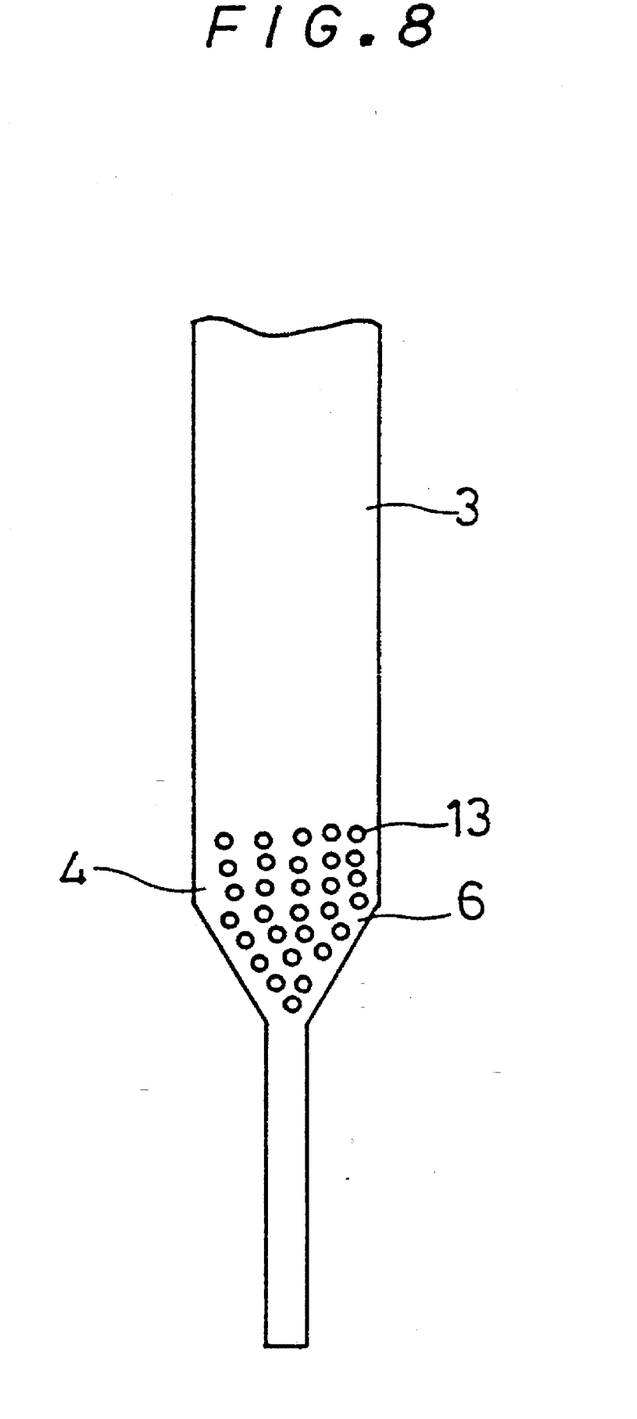
FIG. 8 is a front elevational view showing construction of a lower portion of a lead in accordance with another modification of the present invention.

As can be seen in FIG. 8, many holes or recesses 13 may be formed in the lead, whereby it is expected that flux and solder may easily rise.

Furthermore, in order to generate capillarity of soldering flux, the lower portion 4 of the lead 1 may be provided with a plurality of projections, or may be reticulated or porous.

While the invention has been shown and described in detail, the foregoing description is in all aspects illustrative and not restrictive. It is therefore understood that numerous modifications and variations can be devised without departing the scope of the invention.

I claim:

1. A lead for supporting an upper substrate opposite a lower substrate and electrically connecting an electrode on the upper substrate to an electrode on the lower substrate comprising:

an upper lead portion for joining to an electrode of an upper substrate; and a lower lead portion for soldering to an electrode on a lower substrate, said lower lead portion including (a) means for inducing capillary flow of soldering flux during soldering of said lower lead portion to the electrode on the lower substrate comprising a through hole in said lower lead portion elongated in a longitudinal direction of said lead, (b) a body, and (c) a tip of reduced cross-section for insertion into a through hole of the lower substrate.

2. The lead in accordance with claim 1 wherein said means comprises a bend.

3. The lead in accordance with claim 1 wherein the electrode of the lower substrate comprises a through hole in the lower substrate and an electrically conducting coating on the through hole.

4. The lead in accordance with claim 1 wherein said lower lead portion comprises a tapered portion connecting said body to said tip.

5. The lead in accordance with claim 1 wherein said upper lead portion comprises a clip for holding an edge of the upper substrate.

6. The lead in accordance with claim 5 wherein the electrode on the upper substrate includes a pad electrode adjacent an edge of the upper substrate for engagement by said clip.

7. The lead in accordance with claim 1 wherein said means for inducing capillary flow comprises a plurality of through-holes in said lower lead portion elongated in the longitudinal direction of said lead.

8. A lead for supporting an upper substrate opposite a lower substrate and electrically connecting an electrode on the upper substrate to an electrode on the lower substrate comprising:

an upper lead portion for joining to an electrode of an upper substrate; and a lower lead portion for soldering to an electrode on a lower substrate, said lower lead portion including (a) means for inducing capillary flow of soldering flux during soldering of said lower lead portion to the electrode of the lower substrate comprising a recess in said lower lead portion elongated in a longitudinal direction of said lead, (b) a body, and (c) a tip of reduced cross-section for insertion into a through hole of the lower substrate, said tip being spaced from the recess.

9. The lead in accordance with claim 8 wherein the recess is formed by embossing.

10. The lead in accordance with claim 8 wherein said means for inducing capillary flow comprises a plurality of recesses in said lower lead portion elongated in the longitudinal direction of said lead.

11. A method of assembling an integrated circuit device wherein a plurality of leads holds an upper substrate opposite a lower substrate and connects a plurality of electrodes on the upper substrate to respective through-hole electrodes of the lower substrate, each of said leads having an upper lead portion joined to a respective through-hole electrode on the upper substrate and a lower lead portion soldered to a respective electrode on the lower substrate, each of said lower lead portions including a tip and means for inducing capillary flow of soldering flux during soldering of said lower lead portions comprising a respective through hole in each of said lower lead portions elongated in respective longitudinal directions of said lower lead portions, said method comprising:

joining said upper lead portion of each of said leads to a respective electrode on the upper substrate;

inserting said tips of said lower lead portions into a through hole of a respective through-hole electrode of the lower substrate; and soldering said lower lead portion of each of said leads to the respective through-hole electrodes of the lower substrate wherein, during soldering, soldering flux flows along said lower lead portions by capillary flow induced by the elongated through holes.

12. The method of claim 11 wherein said means for inducing capillary flow comprises a plurality of through-holes in each of said lower lead portions elongated in the respective longitudinal directions of said lower lead portions.

13. The method of assembling an integrated circuit device in accordance with claim 11 wherein said lower lead portions of each of said leads comprises a bend.

14. The method of assembling an integrated circuit device in accordance with claim 11 wherein said lower lead portion of each of said leads has a stepped configuration stepped by bending and including arranging a plurality of said leads in a line so that respective bending directions of alternating leads are opposite from each other.

15. The method of assembling an integrated circuit device in accordance with claim 14 wherein each of said through-hole electrodes of the lower substrate comprises the through hole in the lower substrate and an electrically conducting coating on the through hole.

16. The method of assembling an integrated circuit device in accordance with claim 11 wherein said lower lead portion of each of said leads comprises a body having a larger cross-section than the through holes of the through-hole electrodes.

17. The method of assembling an integrated circuit device in accordance with claim 16 wherein said lower lead portion of each of said leads comprises a tapered portion connecting said body to said tip.

18. The method of assembling an integrated circuit device in accordance with claim 17 wherein said upper lead portion of each of said leads comprises a clip for holding an edge of the upper substrate between upper and lower surfaces of each of said clips including joining said upper lead portions to the upper substrate by inserting the upper substrate in to said clips.

19. The method of assembling an integrated circuit device in accordance with claim 18 wherein the electrodes of the upper substrate include pad electrodes located adjacent to an edge of the upper substrate including bringing each of said clips into contact with corresponding pad electrodes.

20. A method of assembling an integrated circuit device wherein a plurality of leads holds an upper substrate opposite a lower substrate and connects a plurality of electrodes on the upper substrate to respective through-hole electrodes on the lower substrate, each of said leads having an upper lead portion joined to a respective electrode on the upper substrate and a lower lead portion soldered to a respective through-hole electrode on the lower substrate, said lower lead portions including means for inducing capillary flow of soldering flux during soldering of said lower lead portions comprising respective recesses in said lower lead portions elongated in respective longitudinal directions of said lower lead portions, said method comprising:

joining said upper lead portion of each of said leads to a respective electrode on the upper substrate;

inserting said lower lead portions into a through hole of a respective through-hole electrode in the lower substrate, the recesses being spaced from the through holes; and soldering said lower lead portion of each of said leads to the respective through-hole electrodes of the lower substrate wherein, during soldering, soldering flux flows along said lower lead portions by capillary flow induced by the elongated recesses.

21. The method of claim 20 wherein said means for inducing capillary flow comprises a plurality of recesses in each of said lower lead portions elongated in the respective longitudinal directions of said lower lead portions.

22. The method of assembling an integrated circuit device in accordance with claim 20 is including forming the recesses by embossing.

23. An integrated circuit device comprising:

an upper substrate having a plurality of electrodes;

a lower substrate having a plurality of through-hole electrodes; and a plurality of leads, each of said leads having an upper lead portion joined to a respective electrode of said upper substrate and a lower lead portion inserted into and soldered to a respective through hole of a through-hole electrode of said lower substrate, each of said lower lead portions including means for inducing capillary flow of soldering flux during soldering of said lower lead portion to a through-hole electrode of said lower substrate comprising a respective through hole in each of said lower lead portions elongated in respective longitudinal directions of said lower lead portions and wherein said upper substrate is held opposite said lower substrate by said leads.

24. The integrated circuit device of claim 23 wherein said means for inducing capillary flow comprises a plurality of through-holes in each of said lower lead portions elongated in the respective longitudinal directions of said lower lead portions.

25. The integrated circuit device in accordance with claim 23 wherein said means of each of said leads further comprise a bend.

26. The integrated circuit device in accordance with claim 23 wherein said lower lead portion of each of said leads has a stepped configuration where at least a portion of said lower lead portion is stepped by bending and said leads are arranged in a line with respective bending directions of said leads alternating.

27. The integrated circuit device in accordance with claim 23 wherein said lower lead portion of each of said leads comprises a body and a tip thinner than said body inserted in a respective through-hole electrode in said lower substrate.

28. The integrated circuit device in accordance with claim 27 wherein each of said leads comprises a tapered portion connecting said body to said tip of.

29. The integrated circuit device in accordance with claim 28 wherein said upper lead portion of each of said upper substrate.

30. The integrated circuit device in accordance with claim 29 wherein said electrodes of said upper substrate include pad electrodes adjacent an edge if said upper substrate contacted by a respective clip.

31. An integrated circuit device comprising:

an upper substrate having a plurality of electrodes;

a lower substrate having a plurality of through-hole electrodes; and a plurality of leads, each of said leads having an upper lead portion joined to a respective electrode of said upper substrate and a lower lead portion inserted into a soldered to a respective through hole of a through-hole electrode of said lower substrate, each of said lower lead portions including means for inducing capillary flow of soldering flux during soldering of said lower lead portion to a through-hole electrode of said lower substrate comprising a respective recess in each of said lower lead portions elongated in respective longitudinal directions of said lower lead portions, wherein said upper substrate is held opposite said lower substrate by said leads and the recesses are disposed between said upper and lower substrates.

32. The integrated circuit device of claim 31 wherein said means for inducing capillary flow comprises a plurality of recesses in each of said lower lead portions elongated in the respective longitudinal directions of said lower lead portions.

33. The integrated circuit device in accordance with claim 31 wherein the recesses are formed by embossing.

34. A lead for providing a conductive path from an electrode on a substrate comprising:

a lower lead portion for soldering to an electrode and including (a) means for inducing capillary flow of soldering flux during soldering of said lower lead portion to the electrode comprising a through hole in said lower lead portion elongated in a longitudinal direction of said lead, (b) a body, and (c) a tip of reduced cross-section for insertion into a through hole of the lower substrate; and an upper lead portion for providing an electrical connection to another object.

35. The lead of claim 34 wherein said means for inducing capillary flow comprises a plurality of through-holes in said lower lead portion elongated in the longitudinal direction of said lead.

36. The lead for providing a conductive path in accordance with claim 34 wherein said means further comprises a bend.

37. The lead for providing a conductive path in accordance with claim 34 wherein the electrode is a through-hole electrode including a through hole in a substrate and an electrically conducting coating on the through hole.

38. The lead for providing a conductive path in accordance with claim 34 wherein said lower lead portion comprises a tip, body, and a tapered portion connecting said body to said tip.

39. A lead for providing a conductive path from an electrode on a substrate comprising:

a lower lead portion for soldering to an electrode and including (a) means for inducing capillary flow of soldering flux during soldering of said lower lead portion to the electrode comprising a recess in said lower lead portion elongated in a longitudinal direction of said lead, (b) a body, and (c) a tip of reduced cross-section for insertion into a through hole in a substrate, said tip being spaced from the recess; and an upper lead portion for providing an electrical connection to another object.

40. The lead of claim 39 wherein said means for inducing capillary flow comprises a plurality of recesses in said lower lead portion elongated in the longitudinal direction of said lead.

41. The lead for providing a conductive path in accordance with claim 39 wherein the recess is formed by embossing.

42. A method of providing a conductive path from an electrode on a substrate comprising:

preparing a lead having a lower lead portion for soldering to a through-hole electrode, said lower lead portion having a tip and a structure for inducing capillary flow of soldering flux during soldering of said tip to the electrode, said structure comprising a through hole in said lead elongated in a longitudinal direction of said lead, and an upper lead portion for making an electrical connection to another object;

inserting said tip into a through hole of the through-hole electrode; and soldering said lower portion of a said lead to the through-hole electrode so that soldering flux flows to said lower lead portion by capillary flow induced by the elongated through hole.

43. The method of providing a conductive path in accordance with claim 42 wherein said lower portion of said lead comprises a bend.

44. The method of providing a conductive path in accordance with claim 42 wherein said lower portion of said lead comprises a body of said lower portion and a tip that is thinner than said body.

45. The method of providing a conductive path in accordance with claim 44 wherein said lower lead portion comprises a tapered portion connecting said body to said tip.

46. The method of claim 42 wherein said means for inducing capillary flow comprises a plurality of through-holes in said lead elongated in the longitudinal direction of said lead.

47. A method of providing a conductive path from an electrode on a substrate comprising:

preparing a lead having a lower lead portion for soldering to a through-hole electrode, said lower lead portion having a tip and a structure for inducing capillary flow of soldering flux during soldering of said tip to the through-hole electrode, said structure comprising a recess in said lead elongated in a longitudinal direction of said lead, and an upper lead portion for making an electrical connection to another object;

inserting said tip into a through hole of the through-hole electrode, the recess being spaced from the through hole; and soldering said lower portion of said lead to the through-hole electrode so that soldering flux flows to said lower lead portion by capillary flow induced by the elongated recess.

48. The method of providing a conductive path in accordance with claim 47 wherein said recess is formed by embossing.

49. The method of claim 47 wherein said means for inducing capillary flow comprises a plurality of recesses in said lead elongated in the longitudinal direction of said lead.

* * * * *

UNITED STATES PATENT AND TRADEMARK OFFICE
CERTIFICATE OF CORRECTION

PATENT NO. : 5,460,319
DATED : October 24, 1995
INVENTOR(S) : Kato

It is certified that error appears in the above-indentified patent and that said Letters Patent is hereby corrected as shown below:

Column 9, Line 44, delete "in to" and insert --into--.

Column 10, Line 13, delete "is";

Line 38, change "comprise" to --comprises--;

Line 49, delete "electrode";

Line 53, delete "of";

Line 55, after "said" (second occurrence) insert --leads comprises a clip for holding an edge of said--;

Column 11, Line 1, change "a" (second occurrance) to --and--.

Column 12, line 18, delete "a".

Signed and Sealed this

Sixteenth Day of July, 1996

Attest:

BRUCE LEHMAN

Attesting Officer

Commissioner of Patents and Trademarks